United States Patent
von Rhein

(10) Patent No.: US 9,835,713 B2
(45) Date of Patent: Dec. 5, 2017

(54) DEVICE HAVING A VOLTAGE-CONTROLLED OSCILLATOR AND A SWITCHING ARRANGEMENT FOR SELF-CALIBRATION

(75) Inventor: Andreas von Rhein, Salzkotten (DE)

(73) Assignee: Hella KGaA Hueck & Co., Lippstadt (DE)

( * ) Notice: Subject to any disclaimer, the term of this patent is extended or adjusted under 35 U.S.C. 154(b) by 863 days.

(21) Appl. No.: 13/981,513

(22) PCT Filed: Dec. 5, 2011

(86) PCT No.: PCT/EP2011/071709
§ 371 (c)(1),
(2), (4) Date: Dec. 18, 2013

(87) PCT Pub. No.: WO2012/076450
PCT Pub. Date: Jun. 14, 2012

(65) Prior Publication Data
US 2014/0145874 A1    May 29, 2014

(30) Foreign Application Priority Data

Dec. 6, 2010 (DE) ........................ 10 2010 061 041

(51) Int. Cl.
*G01S 7/40* (2006.01)
*G01S 7/35* (2006.01)
*H03L 7/18* (2006.01)

(52) U.S. Cl.
CPC ....... *G01S 7/40* (2013.01); *G01S 7/35* (2013.01); *G01S 7/4008* (2013.01); *H03L 7/18* (2013.01)

(58) Field of Classification Search
CPC .................. G01S 7/40; G01S 7/45; G01S 7/35
(Continued)

(56) References Cited

U.S. PATENT DOCUMENTS

| 5,867,536 A * | 2/1999 | Lyons | G01S 13/931 |
| | | | 332/126 |
| 5,907,263 A * | 5/1999 | Divine | H03L 7/099 |
| | | | 331/16 |

(Continued)

FOREIGN PATENT DOCUMENTS

WO    0028349 A1    5/2000

OTHER PUBLICATIONS

English translation of Written Opinion for International Application No. PCT/EP2011/071709.

*Primary Examiner* — Marcus E Windrich
(74) *Attorney, Agent, or Firm* — Husch Blackwell LLP

(57) ABSTRACT

A device, particularly a radar sensor, has a voltage-controlled oscillator for generating a high-frequency signal which has an actual frequency, a voltage adjusting device to control the oscillator, and a calibration device operable for adjusting a voltage value which is assigned to a value of a target frequency. The calibration device is operable for finding a difference between a frequency and the target frequency corresponding to the voltage set at the oscillator. The calibration device is also operable for generating a low-frequency signal from the high-frequency signal, determining the oscillation period of the low-frequency signal, calculating an auxiliary frequency from the oscillation period of the low-frequency signal, wherein the auxiliary frequency corresponds to the actual frequency of the high-frequency signal, and for adjusting the voltage value assigned to the target frequency according to the frequency difference between the auxiliary frequency and the target frequency.

4 Claims, 1 Drawing Sheet

(58) Field of Classification Search
 USPC .................................................. 342/70, 174
 See application file for complete search history.

(56) References Cited

U.S. PATENT DOCUMENTS

| | | | |
|---|---|---|---|
| 6,473,598 B1* | 10/2002 | Sepehry-Fard | H04B 1/0483 455/334 |
| 2006/0071720 A1 | 4/2006 | Doi | |
| 2007/0080751 A1* | 4/2007 | Tu | H03L 7/18 331/16 |
| 2007/0153953 A1* | 7/2007 | Garzarolli | H03L 7/10 375/376 |
| 2008/0061891 A1* | 3/2008 | Hongo | G01S 7/023 331/17 |
| 2008/0256382 A1 | 10/2008 | Jacobowitz et al. | |
| 2008/0284651 A1* | 11/2008 | Pearson | G01S 7/4008 342/372 |
| 2009/0115537 A1* | 5/2009 | Ramaswamy | H03L 7/087 331/44 |
| 2009/0167389 A1* | 7/2009 | Reis | H03L 7/099 327/159 |

\* cited by examiner

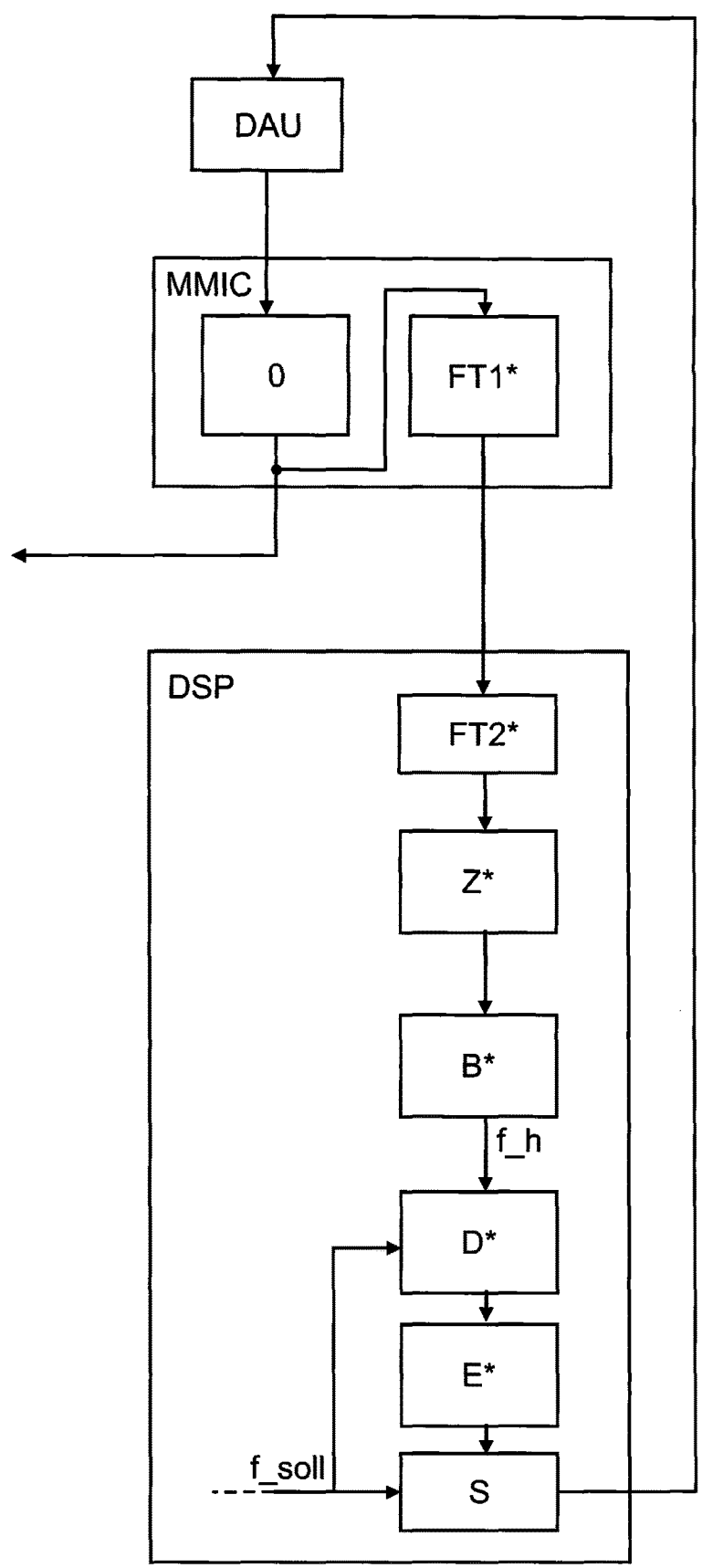

DEVICE HAVING A VOLTAGE-CONTROLLED OSCILLATOR AND A SWITCHING ARRANGEMENT FOR SELF-CALIBRATION

CROSS REFERENCE

This application claims priority to PCT Application No. PCT/EP2011/071709, filed Dec. 5, 2011, which in turn claims priority to German Application No. 10 2010 061 042.9, filed Dec. 6, 2010, each of which is incorporated in its entirety by reference herein.

TECHNICAL FIELD OF THE INVENTION

The invention relates to a device, particularly a radar sensor, e. g. for a motor vehicle,
   having a voltage-controlled oscillator to generate a high-frequency signal with an actual frequency,
   having a means for adjusting a voltage to control the oscillator, wherein one voltage value of the voltage which controls the oscillator is functionally assigned to each value of a target frequency, and
   having a means for the purpose of calibration, by means of which it is possible to adjust the voltage value which is assigned to a value of the target frequency, and the means for calibration having a means for finding a frequency difference between a frequency and the target frequency corresponding to the voltage set at the oscillator.

The invention also relates to a method for the calibration of such a device.

BACKGROUND OF THE INVENTION

Motor vehicles today are increasingly equipped with radar systems, in order to detect the distance of objects from the motor vehicle and the relative speed of said objects in reference to the motor vehicle. The detected distances and relative speeds may be used in various driver assistance systems. Such driver assistance systems may include automatic headlight range controls, the automatic selection of the light distribution pattern, an automatic adjustment of vertical or horizontal light-dark boundaries, brake assist systems, or the like, by way of example. In these radar systems, the device mentioned at the outset can be used with a voltage-controlled oscillator.

The European patent publication with the publication number EP 1 325 350 B1 discloses a method and a device for determining the distance and relative speed of an object distanced from the motor vehicle. The patent publication suggests a FMFSK method (frequency modulated frequency shift keying). This device, which uses the method, has a voltage-controlled oscillator which is used to generate multiple signals for transmission. Each signal has several segments with frequencies which differ from each other but are constant within the segment. The segments are transmitted consecutively, and the frequency of the signal segments of a signal are increased from one segment to the next. However, the segments of a signal are not transmitted directly one after the other. Rather, each segment of one signal is followed by a segment of another signal. In this case, the alternation between the signal segments always occurs in the same sequence, and is repeated in each clock cycle. The result is interleaved signal segments. The frequency is always kept constant during a signal segment.

In order to obtain the best possible results using this method, it is only possible to use voltage-controlled oscillators which have specific basic characteristics with respect to the rigidity, warping, aging, and temperature drift of the oscillator. For this reason, during the production of a device like the one described in this patent publication, all voltage-controlled oscillators are tested prior to assembly, and only suitable, controlled oscillators with the same characteristics are selected. In addition, during operation, cycles are inserted into the ongoing operation process at regular intervals, wherein the voltage-controlled oscillators are calibrated during said cycles in order to compensate for such things as temperature drift, for example. The calibration is carried out by means of a phase lock loop (PLL). The phase lock loop included for the purpose of calibration includes a means, also known as a phase detector, for finding a frequency difference, a means, also known as a filter, for the purpose of adjusting the voltage used to control the oscillator, the voltage-controlled oscillator, and optionally a frequency divider. During the calibration cycles the devices cannot be used for the purpose of generating radar signals to measure distance and relative speed. This is disadvantageous for the driver assist systems in that the driver assist systems cannot be provided with real-time data from the road during said period.

SUMMARY OF THE INVENTION

The invention addresses the problem of modifying a device of the type named above in such a manner that no or hardly any measurement cycles are lost for the purpose of calibration.

This problem is addressed in that the means for the calibration also has, in addition to the means named above,
   one or more frequency dividers for generating a low-frequency signal from the high-frequency signal,
   one means for determining the oscillation period of the low-frequency signal,
   one means for calculating a high-frequency auxiliary frequency from the oscillation period of the low-frequency signal, wherein the auxiliary frequency corresponds to the actual frequency of the high-frequency signal, and
   one means for adjusting the voltage value assigned to the target frequency according to the frequency difference between the auxiliary frequency and the target frequency.

The calculated auxiliary frequency can be used with sufficient precision to determine the deviation of the actual frequency from the target frequency. The means for finding a frequency difference is used for this purpose. The frequency difference, which is the error signal from the perspective of a control technician, can be used in the device according to the invention for the purpose of modifying the voltage values assigned to the target frequencies, and thereby calibrating the device. Methods for the calibration of a device according to the invention are given in claims 9 and 10.

The low-frequency signal is advantageously digital, and has a frequency of 0.5 to 1.5 kHz. The determination of the oscillation period of this low-frequency signal takes approx. 2 ms using a device according to the invention. The frequency at 24 GHz can be calculated from the determined oscillation period, using the means for calculating the high-frequency auxiliary frequency, by finding the reciprocal of, and scaling, all of the division values. If the calculation is carried out using a digital signal processor at, by way of example, 150 MHz, it is possible to achieve a precision of the auxiliary frequency of +/−160 kHz.

Using a device according to the invention, the determination of the frequency difference, and the subsequent adjustment of the voltage values assigned to the target frequencies, can be carried out much more quickly than in the prior art. As such, it is possible to use the time remaining between two measurement cycles, by way of example, for calibrating a device according to the invention. As a result, no measurement cycle time is lost. The measurements can be carried out continuously.

By means of the frequency divider(s) of a device according to the invention, it is possible to reduce the actual frequency from 24 GHz to 1 KHz, for example. The signal generated in this manner can be processed by a conventional digital signal processor. At least one of the frequency dividers—or the frequency divider—can be a frequency divider which is integrated into an integrated phase lock loop (PLL). At least one of the frequency dividers—or the frequency divider—can likewise be a frequency divider of an MMIC (millimeter monolithic integrated circuit). At least one of the frequency dividers—or the frequency divider—can be a frequency divider of a digital signal processor.

The means for determining the oscillation period of the low-frequency signal can be a counter. The counter can be arranged in a and/or in the digital signal processor.

The means for calculating the auxiliary frequency from the oscillation period of the low-frequency signal can be arranged in a and/or in the digital signal processor.

The means for finding the frequency difference signal can also be arranged in a and/or in the digital signal processor.

The or a digital signal processor can be suitable for, and set up for the task of, adjusting the voltage values assigned to the target frequencies according to the error signal. The digital signal processor can also be suitable for, and set up for the task of, saving the assignment.

A method according to the invention which can be carried out by a device according to the invention for the purpose of calibration can have the following steps:
  conversion of the high-frequency signal generated by the voltage-controlled oscillator to a low-frequency signal, by means of the frequency divider or the frequency dividers,
  determination of the oscillation period of the low-frequency signal, preferably by means of a counter,
  calculation of an auxiliary frequency from the oscillation period of the low-frequency signal,
  comparison of the auxiliary frequency and the target frequency,
  adjustment of the voltage value of the voltage, which is assigned to the target frequencies, to control the oscillator according to the frequency difference between the target frequency and the auxiliary frequency.

It is particularly advantageous if the adjustment of one of the voltage values is directly calculated from the frequency difference, while the adjustments of further voltage values are determined by inter- and/or extrapolation. In this way, a particularly fast calibration is possible.

These aspects are merely illustrative of the innumerable aspects associated with the present invention and should not be deemed as limiting in any manner. These and other aspects, features and advantages of the present invention will become apparent from the following detailed description when taken in conjunction with the referenced drawings.

BRIEF DESCRIPTION OF THE DRAWINGS

Reference is now made more particularly to the drawings, which illustrate the best presently known mode of carrying out the invention and wherein similar reference characters indicate the same parts throughout the views.

FIG. 1 shows a simplified block diagram of a device according to the invention.

DETAILED DESCRIPTION

In the following detailed description numerous specific details are set forth in order to provide a thorough understanding of the invention. However, it will be understood by those skilled in the art that the present invention may be practiced without these specific details. For example, the invention is not limited in scope to the particular type of industry application depicted in the figures. In other instances, well-known methods, procedures, and components have not been described in detail so as not to obscure the present invention.

The simple design of a device according to the invention as shown in the FIGURE includes three integrated circuits, specifically a digital/analog converter DAU, a millimeter monolithic integrated circuit MMIC, and a digital signal processor DSP.

The digital signal processor DSP has a means for adjusting a digital voltage value according to a prespecified target frequency f_soll, which can be provided to the digital/analog converter DAU via an output of the digital signal processor DSP. The digital/analog converter DAU converts the digital voltage signal into an analog voltage signal. This analog signal is applied to an input of the millimeter monolithic integrated circuit MMIC. Inside of the millimeter monolithic integrated circuit MMIC, the input is connected to a voltage-controlled oscillator O. The voltage-controlled oscillator O generates a high-frequency signal with a frequency of, by way of example, 24 GHz, corresponding to the voltage value of the applied voltage. The high-frequency signal is applied to an output of the millimeter monolithic integrated circuit MMIC and can be tapped at this point for further use.

Inside the millimeter monolithic integrated circuit MMIC, the high-frequency signal is fed to a first frequency divider FT1. The output of the first frequency divider FT1 is connected to an output of the millimeter monolithic integrated circuit MIMIC. The digital, mid-frequency signal generated by the first frequency divider FT1 is fed via a connection from the output of the millimeter monolithic integrated circuit MMIC to an input of the digital/analog converter DSP.

Inside the digital/analog converter DSP, the input is connected to a second frequency divider FT2, by means of which the mid-frequency signal is converted into a low-frequency signal with a frequency of, by way of example, 1 kHz.

The low-frequency signal is fed to a means for determining the oscillation period of the low-frequency signal, in the form of a counter Z. The oscillation period of the low-frequency signal, determined in this manner, is fed to a means B for calculating an auxiliary frequency from the oscillation period of the low-frequency signal, which finds the reciprocal and calculates an auxiliary frequency f_h by scaling according to the division factors of the first and the second frequency dividers, said auxiliary frequency (f_h) corresponding to the actual frequency of the high-frequency signal at the output of the voltage-controlled oscillator, aside from any errors.

The auxiliary frequency f_h and the target frequency f_soll are fed to a means B for finding a frequency difference from the auxiliary frequency and the target frequency f_soll corresponding to the voltage applied at the oscillator. The frequency difference is fed to a means E for adjusting the voltage value assigned to the target frequency according to the frequency difference between the auxiliary frequency f_h and the target frequency f_soll. The adjustments which are necessary for the calibration are carried out by this means E, such that subsequently the means S for adjusting a digital voltage value can provide the digital/analog converter DAU with an optionally modified voltage value, so that the actual frequency corresponds more precisely to the target frequency.

The preferred embodiments of the invention have been described above to explain the principles of the invention and its practical application to thereby enable others skilled in the art to utilize the invention in the best mode known to the inventors. However, as various modifications could be made in the constructions and methods herein described and illustrated without departing from the scope of the invention, it is intended that all matter contained in the foregoing description or shown in the accompanying drawings shall be interpreted as illustrative rather than limiting. Thus, the breadth and scope of the present invention should not be limited by the above-described exemplary embodiment, but should be defined only in accordance with the following claims appended hereto and their equivalents.

LIST OF REFERENCE NUMBERS

DAU digital/analog converter
MMIC millimeter monolithic integrated circuit
DSP digital signal processor
* means for calibration
O voltage-controlled oscillator
FT1 first frequency divider
FT2 second frequency divider
Z means for determining the oscillation period of the low-frequency signal/counter
B means for calculating an auxiliary frequency from the oscillation period of the low-frequency signal
D means for finding a frequency difference from the auxiliary frequency and the target frequency corresponding to the voltage set at the oscillator
E means for adjusting the voltage value assigned to the target frequency according to the frequency difference between the auxiliary frequency and the target frequency
S means for adjusting a digital voltage value

The invention claimed is:
1. A radar sensor, the radar sensor comprising:
a millimeter monolithic integrated circuit comprising:
  a voltage-controlled oscillator for generating a high-frequency analog signal which has an actual frequency,
  a first frequency divider in communication with the voltage-controlled oscillator and the analog to digital converter for generating a first low-frequency digital signal from the high-frequency analog signal generated by the voltage-controlled oscillator,
an analog to digital converter within the millimeter monolithic integrated circuit or in direct communication with the millimeter monolithic integrated circuit, and
a digital signal processor in direct communication with the millimeter monolithic integrated circuit, the digital signal processor including:
  a second frequency divider for generating a second low-frequency digital signal having a frequency less than the first low-frequency signal,
  a counter in direct communication with the second frequency divider for determining an oscillation period of the second low-frequency signal,
  a processor in direct communication with the counter for calculating an auxiliary frequency of the second low-frequency signal from the oscillation period,
  said processor also finding a frequency difference between the auxiliary frequency and a target frequency,
  a calibration device in direct communication with the processor to adjust the voltage value which is assigned to a value of the target frequency according to the frequency difference between the auxiliary frequency and a target frequency, and
  a voltage adjusting device in direct communication with the calibration device for adjusting a digital voltage value of the oscillator, and
a digital to analog converter for converting the digital voltage value to an analog voltage value and providing the analog voltage value to the voltage-controlled oscillator.

2. The radar sensor according to claim 1, characterized in that one of the frequency dividers is integrated into an integrated phase lock loop.

3. A method for the control of a radar sensor, the steps comprising:
  generating a high-frequency analog signal which has an actual frequency via a voltage-controlled oscillator,
  generating a first low-frequency digital signal from the high-frequency analog signal generated by the voltage-controlled oscillator via a first frequency divider and an analog to digital converter,
  generating a second low-frequency digital signal having a frequency less than the first low-frequency signal via a second frequency divider,
  determining an oscillation period of the second low-frequency signal via a counter in direct communication with the second frequency divider,
  calculating an auxiliary frequency of the second low-frequency signal from the oscillation period via a processor in direct communication with the counter,
  finding a frequency difference between the auxiliary frequency and a target frequency via said processor,
  utilizing a calibration device in direct communication with the processor to adjust the voltage value which is assigned to a value of the target frequency according to the frequency difference between the auxiliary frequency and a target frequency,
  utilizing a voltage adjusting device in direct communication with the calibration device for adjusting a digital voltage value of the oscillator, and
  converting the digital voltage value to an analog voltage value using a digital to analog converter and providing the analog voltage value to the voltage-controlled oscillator.

4. The method according to claim 3, wherein the adjustment of one of the voltage values is directly calculated from the frequency difference, while the adjustments of further voltage values are determined by at least one of interpolation and extrapolation.

* * * * *